(12) United States Patent
Haba

(10) Patent No.: US 11,462,419 B2
(45) Date of Patent: Oct. 4, 2022

(54) MICROELECTRONIC ASSEMBLIES

(71) Applicant: INVENSAS BONDING TECHNOLOGIES, INC., San Jose, CA (US)

(72) Inventor: Belgacem Haba, Saratoga, CA (US)

(73) Assignee: INVENSAS BONDING TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/503,021

(22) Filed: Jul. 3, 2019

(65) Prior Publication Data

US 2020/0013637 A1     Jan. 9, 2020

Related U.S. Application Data

(60) Provisional application No. 62/694,543, filed on Jul. 6, 2018.

(51) Int. Cl.
    *H01L 21/56*     (2006.01)
    *H01L 21/768*     (2006.01)
    (Continued)

(52) U.S. Cl.
    CPC ...... *H01L 21/565* (2013.01); *H01L 21/76819* (2013.01); *H01L 21/76877* (2013.01);
    (Continued)

(58) Field of Classification Search
    CPC .......... H01L 21/565; H01L 21/76819; H01L 23/3107; H01L 21/76877; H01L 21/82;
    (Continued)

(56) References Cited

U.S. PATENT DOCUMENTS 4,998,665 A     3/1991    Hayashi
5,019,673 A     5/1991    Juskey et al.
(Continued)

FOREIGN PATENT DOCUMENTS

CN     103681646     3/2014
EP     1011133 A1     6/2000
(Continued)

OTHER PUBLICATIONS

Amirfeiz et al., "Formation of silicon structures by plasma-activated wafer bonding," Journal of The Electrochemical Society, 2000, vol. 147, No. 7, pp. 2693-2698.
(Continued)

*Primary Examiner* — Cuong B Nguyen
(74) *Attorney, Agent, or Firm* — Knobbe, Martens, Olson & Bear LLP

(57) ABSTRACT

Various embodiments of fanout packages are disclosed. A method of forming a microelectronic assembly is disclosed. The method can include bonding a first surface of at least one microelectronic substrate to a surface of a carrier using a direct bonding technique without an intervening adhesive, the microelectronic substrate having a plurality of conductive interconnections on at least one surface of the microelectronic substrate. The method can include applying a molding material to an area of the surface of the carrier surrounding the microelectronic substrate to form a reconstituted substrate. The method can include processing the microelectronic substrate. The method can include singulating the reconstituted substrate at the area of the surface of the carrier and at the molding material to form the microelectronic assembly.

19 Claims, 7 Drawing Sheets

(51) Int. Cl.
    *H01L 23/31*     (2006.01)
    *H01L 21/82*     (2006.01)
    *H01L 23/528*     (2006.01)

(52) U.S. Cl.
    CPC .......... *H01L 21/82* (2013.01); *H01L 23/3107* (2013.01); *H01L 23/528* (2013.01); *H01L 2224/02379* (2013.01)

(58) Field of Classification Search
    CPC ......... H01L 23/528; H01L 2224/02379; H01L 2224/18; H01L 24/97; H01L 24/19; H01L 24/20; H01L 21/568; H01L 25/0657; H01L 25/50; H01L 2225/06524; H01L 2225/06541; H01L 2225/06565; H01L 24/18; H01L 23/3114; H01L 21/561
    See application file for complete search history.

(56) References Cited

U.S. PATENT DOCUMENTS

| | | | |
|---|---|---|---|
| 5,051,802 A | 9/1991 | Prost et al. | |
| 5,087,585 A | 2/1992 | Hayashi | |
| 5,322,593 A | 6/1994 | Hasegawa et al. | |
| 5,753,536 A | 5/1998 | Sugiyama et al. | |
| 5,771,555 A | 6/1998 | Eda et al. | |
| 5,854,507 A | 12/1998 | Miremadi et al. | |
| 5,956,605 A | 9/1999 | Akram et al. | |
| 5,985,739 A | 11/1999 | Plettner et al. | |
| 5,998,808 A | 12/1999 | Matsushita | |
| 6,008,126 A | 12/1999 | Leedy | |
| 6,080,640 A | 6/2000 | Gardner et al. | |
| 6,121,688 A | 9/2000 | Akagawa | |
| 6,265,775 B1 | 7/2001 | Seyyedy | |
| 6,374,770 B1 | 4/2002 | Lee | |
| 6,423,640 B1 | 7/2002 | Lee et al. | |
| 6,465,892 B1 | 10/2002 | Suga | |
| 6,582,991 B1 | 6/2003 | Maeda et al. | |
| 6,768,208 B2 | 7/2004 | Lin et al. | |
| 6,782,610 B1 | 8/2004 | Iijima et al. | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,078,811 B2 | 7/2006 | Suga | |
| 7,105,980 B2 | 9/2006 | Abbott et al. | |
| 7,126,212 B2 | 10/2006 | Enquist et al. | |
| 7,193,423 B1 | 3/2007 | Dalton et al. | |
| 7,319,197 B2 | 1/2008 | Oggioni et al. | |
| 7,354,798 B2 | 4/2008 | Pogge et al. | |
| 7,554,203 B2 | 6/2009 | Zhou et al. | |
| 7,582,971 B2 | 9/2009 | Kameyama et al. | |
| 7,589,409 B2 | 9/2009 | Gibson et al. | |
| 7,663,231 B2 | 2/2010 | Chang et al. | |
| 7,750,488 B2 | 7/2010 | Patti et al. | |
| 7,759,751 B2 | 7/2010 | Ono | |
| 7,786,572 B2 | 8/2010 | Chen | |
| 7,803,693 B2 | 9/2010 | Trezza | |
| 7,977,789 B2 | 7/2011 | Park | |
| 8,049,303 B2 | 11/2011 | Osaka et al. | |
| 8,064,224 B2 | 11/2011 | Mahajan et al. | |
| 8,168,458 B2 | 5/2012 | Do et al. | |
| 8,178,963 B2 | 5/2012 | Yang | |
| 8,178,964 B2 | 5/2012 | Yang | |
| 8,183,127 B2 | 5/2012 | Patti et al. | |
| 8,193,632 B2 | 6/2012 | Chang et al. | |
| 8,227,904 B2 | 7/2012 | Braunisch et al. | |
| 8,241,961 B2 | 8/2012 | Kim et al. | |
| 8,263,434 B2 | 9/2012 | Pagaila et al. | |
| 8,314,007 B2 | 11/2012 | Vaufredaz | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,146 B2 | 7/2013 | Chen et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,519,514 B2 | 8/2013 | Fujii | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,691,601 B2 | 4/2014 | Izuha | |
| 8,697,493 B2 | 4/2014 | Sadaka | |
| 8,716,105 B2 | 5/2014 | Sadaka et al. | |
| 8,791,575 B2 | 7/2014 | Oganesian et al. | |
| 8,802,538 B1 | 8/2014 | Liu | |
| 8,809,123 B2 | 8/2014 | Liu et al. | |
| 8,841,002 B2 | 9/2014 | Tong | |
| 8,878,353 B2 | 11/2014 | Haba et al. | |
| 8,901,748 B2 | 12/2014 | Manusharow et al. | |
| 8,912,670 B2 | 12/2014 | Teh et al. | |
| 8,975,726 B2 | 3/2015 | Chen et al. | |
| 8,987,137 B2 | 3/2015 | Bachman et al. | |
| 8,988,299 B2 | 3/2015 | Kam et al. | |
| 9,093,350 B2 | 7/2015 | Endo et al. | |
| 9,126,236 B2 | 9/2015 | Roos et al. | |
| 9,136,293 B2 | 9/2015 | Yee et al. | |
| 9,142,517 B2 | 9/2015 | Liu | |
| 9,153,552 B2 | 10/2015 | Teh et al. | |
| 9,159,690 B2 | 10/2015 | Chiu | |
| 9,171,756 B2 | 10/2015 | Enquist et al. | |
| 9,171,816 B2 | 10/2015 | Teh et al. | |
| 9,184,125 B2 | 11/2015 | Enquist et al. | |
| 9,190,380 B2 | 11/2015 | Teh et al. | |
| 9,224,704 B2 | 12/2015 | Landru | |
| 9,230,941 B2 | 1/2016 | Chen et al. | |
| 9,252,172 B2 | 2/2016 | Chow et al. | |
| 9,257,399 B2 | 2/2016 | Kuang et al. | |
| 9,269,701 B2 | 2/2016 | Starkston et al. | |
| 9,275,971 B2 | 3/2016 | Chiu et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,349,703 B2 | 5/2016 | Chiu et al. | |
| 9,355,997 B2 | 5/2016 | Katkar et al. | |
| 9,368,866 B2 | 6/2016 | Yu | |
| 9,385,024 B2 | 7/2016 | Tong et al. | |
| 9,394,161 B2 | 7/2016 | Cheng et al. | |
| 9,437,572 B2 | 9/2016 | Chen et al. | |
| 9,443,796 B2 | 9/2016 | Chou et al. | |
| 9,443,824 B1 | 9/2016 | We et al. | |
| 9,461,007 B2 | 10/2016 | Chun et al. | |
| 9,466,586 B1 * | 10/2016 | Choi | H01L 21/568 |
| 9,476,898 B2 | 10/2016 | Takano | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,601,353 B2 | 3/2017 | Huang et al. | |
| 9,620,481 B2 | 4/2017 | Edelstein et al. | |
| 9,627,365 B1 | 4/2017 | Yu et al. | |
| 9,656,852 B2 | 5/2017 | Cheng et al. | |
| 9,666,502 B2 | 5/2017 | Chen et al. | |
| 9,666,559 B2 | 5/2017 | Wang et al. | |
| 9,722,098 B1 * | 8/2017 | Chung | H01L 33/483 |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,881,882 B2 | 1/2018 | Hsu et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 9,966,360 B2 | 5/2018 | Yu et al. | |
| 10,008,844 B2 | 6/2018 | Wang et al. | |
| 10,026,605 B2 | 7/2018 | Doub et al. | |
| 10,032,722 B2 | 7/2018 | Yu et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |

(56) References Cited

U.S. PATENT DOCUMENTS

| | | |
|---|---|---|
| 10,269,853 B2 | 4/2019 | Katkar et al. |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,707,087 B2 | 7/2020 | Uzoh et al. |
| 10,727,204 B2 | 7/2020 | Agarwal et al. |
| 10,727,219 B2 | 7/2020 | Uzoh et al. |
| 10,790,262 B2 | 9/2020 | Uzoh et al. |
| 10,879,212 B2 | 12/2020 | Uzoh et al. |
| 10,964,664 B2 | 3/2021 | Mandalapu et al. |
| 10,998,292 B2 | 5/2021 | Lee et al. |
| 11,031,285 B2 | 6/2021 | Katkar et al. |
| 11,056,348 B2 | 7/2021 | Theil |
| 11,056,390 B2 | 7/2021 | Uzoh et al. |
| 11,069,734 B2 | 7/2021 | Katkar |
| 11,088,099 B2 | 8/2021 | Katkar et al. |
| 11,145,626 B2 | 10/2021 | Hwang et al. |
| 11,158,606 B2 | 10/2021 | Gao et al. |
| 11,171,117 B2 | 11/2021 | Gao et al. |
| 11,256,004 B2 | 2/2022 | Haba et al. |
| 11,276,676 B2 | 3/2022 | Enquist et al. |
| 2002/0000328 A1 | 1/2002 | Motomura et al. |
| 2002/0003307 A1 | 1/2002 | Suga |
| 2002/0004288 A1 | 1/2002 | Nishiyama |
| 2002/0074668 A1 | 6/2002 | Hofstee et al. |
| 2004/0084414 A1 | 5/2004 | Sakai et al. |
| 2004/0238927 A1 | 12/2004 | Miyazawa |
| 2005/0040530 A1 | 2/2005 | Shi |
| 2005/0153522 A1 | 7/2005 | Hwang et al. |
| 2005/0218518 A1 | 10/2005 | Jiang et al. |
| 2006/0057945 A1 | 3/2006 | Hsu et al. |
| 2006/0087042 A1 | 4/2006 | Kameyama et al. |
| 2006/0278331 A1 | 12/2006 | Dugas et al. |
| 2007/0080442 A1 | 4/2007 | Meyer-Berg |
| 2007/0096294 A1 | 5/2007 | Ikeda et al. |
| 2007/0111386 A1 | 5/2007 | Kim et al. |
| 2007/0158024 A1 | 7/2007 | Addison et al. |
| 2007/0158827 A1 | 7/2007 | Schuster |
| 2007/0222048 A1 | 9/2007 | Huang |
| 2007/0295456 A1 | 12/2007 | Gudeman et al. |
| 2008/0079105 A1* | 4/2008 | Chang ............... H01L 27/14618 257/434 |
| 2008/0231311 A1 | 9/2008 | Condorelli et al. |
| 2008/0265421 A1 | 10/2008 | Brunnbauer et al. |
| 2008/0308928 A1 | 12/2008 | Chang |
| 2009/0068831 A1 | 3/2009 | Enquist et al. |
| 2009/0149023 A1 | 6/2009 | Koyanagi |
| 2009/0227089 A1 | 9/2009 | Plaut et al. |
| 2009/0252939 A1 | 10/2009 | Park et al. |
| 2009/0283898 A1 | 11/2009 | Janzen et al. |
| 2009/0321939 A1 | 12/2009 | Chandrasekaran |
| 2010/0123268 A1 | 5/2010 | Menard |
| 2010/0167534 A1 | 7/2010 | Iwata |
| 2010/0327424 A1 | 12/2010 | Braunisch et al. |
| 2011/0074033 A1 | 3/2011 | Kaltalioglu et al. |
| 2011/0290552 A1 | 12/2011 | Palmateer et al. |
| 2012/0074585 A1 | 3/2012 | Koo et al. |
| 2012/0187516 A1 | 7/2012 | Sato |
| 2012/0194719 A1 | 8/2012 | Churchwell et al. |
| 2012/0199960 A1 | 8/2012 | Cosue et al. |
| 2012/0212384 A1 | 8/2012 | Kam et al. |
| 2013/0037962 A1 | 2/2013 | Xue |
| 2013/0122655 A1 | 5/2013 | Yu et al. |
| 2013/0265733 A1 | 10/2013 | Herbsommer et al. |
| 2013/0299997 A1 | 11/2013 | Sadaka |
| 2014/0013606 A1 | 1/2014 | Nah et al. |
| 2014/0154839 A1 | 6/2014 | Ahn et al. |
| 2014/0175655 A1 | 6/2014 | Chen et al. |
| 2014/0225795 A1 | 8/2014 | Yu |
| 2014/0299981 A1 | 10/2014 | Goh et al. |
| 2014/0312511 A1 | 10/2014 | Nakamura |
| 2014/0370658 A1 | 12/2014 | Tong et al. |
| 2015/0021754 A1 | 1/2015 | Lin et al. |
| 2015/0064498 A1 | 3/2015 | Tong |
| 2015/0102468 A1 | 4/2015 | Kang et al. |
| 2015/0179481 A1 | 6/2015 | Lin |
| 2015/0194406 A1 | 7/2015 | Teh et al. |
| 2015/0262845 A1 | 9/2015 | Hwang et al. |
| 2015/0340285 A1 | 11/2015 | Enquest et al. |
| 2016/0126634 A1 | 5/2016 | Liu et al. |
| 2016/0163650 A1 | 6/2016 | Gao et al. |
| 2016/0300813 A1 | 10/2016 | Zhai et al. |
| 2016/0300817 A1 | 10/2016 | Do et al. |
| 2016/0322330 A1 | 11/2016 | Lin et al. |
| 2016/0329284 A1 | 11/2016 | We et al. |
| 2016/0343682 A1 | 11/2016 | Kawasaki |
| 2016/0343685 A1 | 11/2016 | Lin et al. |
| 2017/0179078 A1 | 4/2017 | Yu et al. |
| 2017/0125379 A1 | 5/2017 | Chen et al. |
| 2017/0148764 A1 | 5/2017 | Wang et al. |
| 2017/0194271 A1 | 7/2017 | Hsu et al. |
| 2017/0200711 A1 | 7/2017 | Uzoh et al. |
| 2017/0365580 A1 | 12/2017 | Shih et al. |
| 2018/0005984 A1 | 1/2018 | Yu et al. |
| 2018/0012787 A1 | 1/2018 | Oka et al. |
| 2018/0026008 A1 | 1/2018 | Jeng et al. |
| 2018/0053746 A1 | 2/2018 | Yu et al. |
| 2018/0096931 A1 | 4/2018 | Huang et al. |
| 2018/0122774 A1* | 5/2018 | Huang ................ H01L 24/20 |
| 2018/0130769 A1 | 5/2018 | Tan et al. |
| 2018/0138101 A1 | 5/2018 | Yu et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0226375 A1 | 8/2018 | Enquist et al. |
| 2018/0273377 A1 | 9/2018 | Katkar et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2018/0366437 A1 | 12/2018 | Chen et al. |
| 2018/0366442 A1* | 12/2018 | Gu ..................... H01L 25/50 |
| 2018/0366446 A1 | 12/2018 | Haba et al. |
| 2019/0096741 A1 | 3/2019 | Uzoh et al. |
| 2019/0096842 A1 | 3/2019 | Fountain, Jr. et al. |
| 2019/0115277 A1 | 4/2019 | Yu et al. |
| 2019/0131277 A1 | 5/2019 | Yang et al. |
| 2019/0198407 A1 | 6/2019 | Huang et al. |
| 2019/0198409 A1 | 6/2019 | Katkar et al. |
| 2019/0265411 A1 | 8/2019 | Huang et al. |
| 2019/0333550 A1 | 10/2019 | Fisch |
| 2019/0333871 A1 | 10/2019 | Chen et al. |
| 2019/0348336 A1 | 11/2019 | Katkar et al. |
| 2019/0371763 A1 | 12/2019 | Agarwal et al. |
| 2019/0385935 A1 | 12/2019 | Gao et al. |
| 2019/0385966 A1 | 12/2019 | Gao et al. |
| 2019/0385981 A1 | 12/2019 | Chen et al. |
| 2020/0006309 A1 | 1/2020 | Chen et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0075520 A1 | 3/2020 | Gao et al. |
| 2020/0075534 A1 | 3/2020 | Gao et al. |
| 2020/0118973 A1 | 4/2020 | Wang et al. |
| 2020/0126906 A1 | 4/2020 | Uzoh et al. |
| 2020/0176419 A1 | 6/2020 | Dabral et al. |
| 2020/0194396 A1 | 6/2020 | Uzoh |
| 2020/0227367 A1 | 7/2020 | Haba et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2021/0098412 A1 | 4/2021 | Haba et al. |
| 2021/0181510 A1 | 6/2021 | Katkar et al. |

(56) References Cited

U.S. PATENT DOCUMENTS

| | | |
|---|---|---|
| 2021/0183847 A1 | 6/2021 | Uzoh et al. |
| 2021/0193603 A1 | 6/2021 | Katkar et al. |
| 2021/0193625 A1 | 6/2021 | DeLaCruz et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0366970 A1 | 11/2021 | Katkar |
| 2021/0407941 A1 | 12/2021 | Haba |
| 2022/0077063 A1 | 3/2022 | Haba |
| 2022/0077087 A1 | 3/2022 | Haba |
| 2022/0122934 A1 | 4/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |

FOREIGN PATENT DOCUMENTS

| | | |
|---|---|---|
| EP | 2 685 491 A2 | 1/2014 |
| JP | 04-337694 | 11/1992 |
| JP | 2000-100679 | 4/2000 |
| JP | 2001-102479 | 4/2001 |
| JP | 2001-284520 | 10/2001 |
| JP | 2002-353416 | 12/2002 |
| JP | 2002-359345 | 12/2002 |
| JP | 2004-193493 | 7/2004 |
| JP | 2008-130603 A | 6/2008 |
| JP | 2011-171614 | 9/2011 |
| JP | 2013-33786 | 2/2013 |
| JP | 2018-160519 | 10/2018 |
| KR | 10-2001-0104643 | 11/2001 |
| KR | 10-2010-0123755 | 11/2010 |
| KR | 10-2015-0097798 | 8/2015 |
| WO | WO 2005/043584 A2 | 5/2005 |
| WO | WO 2006/100444 A1 | 9/2006 |
| WO | WO 2008/112101 A2 | 9/2008 |
| WO | WO 2010/024678 A1 | 3/2010 |
| WO | WO 2017/034654 A1 | 3/2017 |
| WO | WO 2017/052652 A1 | 3/2017 |
| WO | WO 2017/151442 A1 | 9/2017 |

OTHER PUBLICATIONS

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. And Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference On, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion dated Apr. 17, 2017, issued in International Application No. PCT/US2016/068577, 16 pages.

International Search Report and Written Opinion dated Sep. 22, 2017, issued in International Application No. PCT/US2017/029187, 20 pages.

International Search Report and Written Opinion dated Mar. 7, 2019, in International Application No. PCT/US2018/060044, 14 pages.

International Search Report and Written Opinion dated Apr. 22, 2019 in International Application No. PCT/US2018/064982, 13 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Kim et al., "Low temperature direct Cu—Cu bonding with low energy ion activation method," Electronic Materials and Packaging, 2001, IEEE, pp. 193-195.

Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.

Kim et al., "Wafer-scale activated bonding of Cu—CU, Cu—Si, and Cu–SiO2 at low temperature," Proceedings—Electrochemical Society, 2003, vol. 19, pp. 239-247.

Matsuzawa et al., "Room-temperature interconnection of electroplated Au microbump by means of surface activated bonding method," Electornic Components and Technology Confererence, 2001, 51st Proceedings, IEEE, pp. 384-387.

Moriceau, H. et al., "Overview of recent direct wafer bonding advances and applications," Advances in Natural Sciences—Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.

Office Action for U.S. Appl. No. 15/159,649, dated Sep. 14, 2017, 9 pages.

Office Action for U.S. Appl. No. 15/389,157, dated Oct. 6, 2017, 18 pages.

(56) References Cited

OTHER PUBLICATIONS

Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviouir," Electrochemical Society Proceedings, 1998, vol. 97-36, pp. 437-444.
Roberds et al., "Low temperature, in situ, plasma activated wafer bonding," Electrochecmical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Confererence, 51st Proceedings, 2001, IEEE, pp. 755-760.
Shingo et al., "Design and fabrication of an electrostatically actuated MEMS probe card," Tranducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mehcanical Systems, MEMS '97 Proceedings, 1997, IEEE, pp. 191-196.

Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of arbon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al, "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microelectomechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Uhrmann, T. et al., "Heterogeneous integration by collective die-to-wafer bonding," Chip Scale Review, Nov./Dec. 2018, vol. 22, No. 6, pp. 10-12.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump—Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Xu et al., "New Au—Al interconnect technology and its reliability by surface activated bonding," Electronic Packaging Technology Proceedings, Oct. 28-30, 2003, Shanghai, China, pp. 479-483.
Ceramic Microstructures: Control at the Atomic Level, Recent Progress in Surface Activated Bonding, 1998, pp. 385-389.
International Search Report and Written Opinion dated Oct. 25, 2019, issued in International Application No. PCT/US2019/040622, 12 pages.
Fukushima, T. et al., "New three-dimensional integration technology using self-assembly technique," International Electron Devices Meeting Dec. 5-7, 2005, IEEE, Dec. 5, 2005, pp. 348-351.
Frumusanu, Andrei, "TSMC's version of EMIB is 'LSI': Currently in pre-qualification," AnaandTech, https://www.anandtech.com/show/16031/tsmcs-version-of-emib-lsi-3dfabric, Aug. 25, 2020, 6 pages.
NASA SBIR/STTR Technologies, Proposal No. 09-1 S5.05-9060—Reliable Direct Bond Copper Ceramic Packages for High Temperature Power Electronics, Contract No. NNX10CE23P, PI: Ender Savrun, PhD, Sienna Technologies, Inc.—Woodinville, WA, 1 page.
"Photo Etching DBG for Power Circuits—Direct Bond Copper (DBG) on Ceramic Used for Power Circuits," Conard Corporation, 2021, downloaded Nov. 9, 2021, https://www.conardcorp.com/photo-etching-dbc-for-power-circuits/, 2 pages.
Urteaga, M. et al., "THz bandwidth InP HBT technologies and heterogeneous integration with Si CMOS," 2016 IEEE Bipolar/BiCMOS Circuits and Technology Meeting (BCTM), 2016, pp. 35-41, doi: 10.1109/BCTM.2016.7738973.
Braunisch, H. et al., "High-speed performance of silicon bridge die-to-die interconnects," 2011 IEEE, pp. 95-98.
Office Action in U.S. Appl. No. 16/917,686, dated Jul. 21, 2022.

* cited by examiner

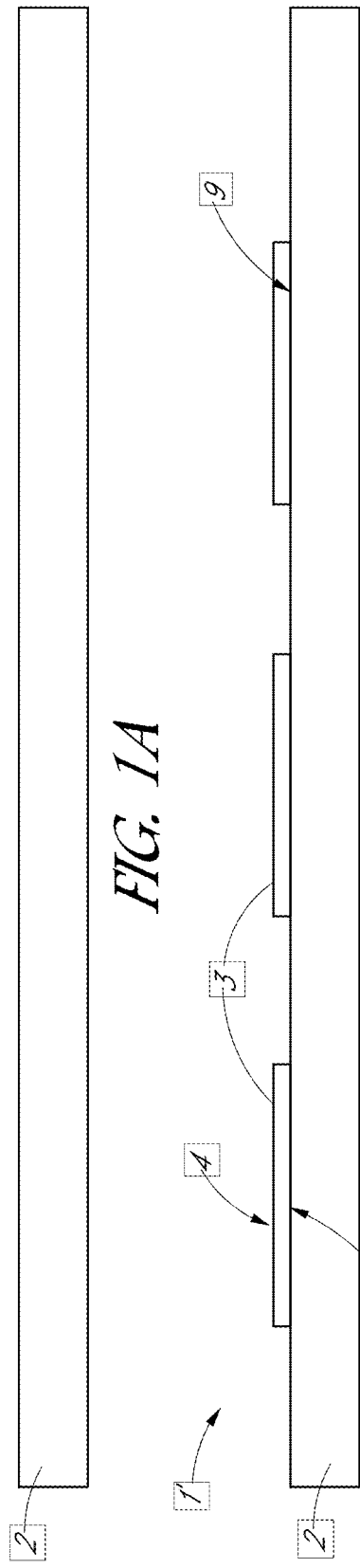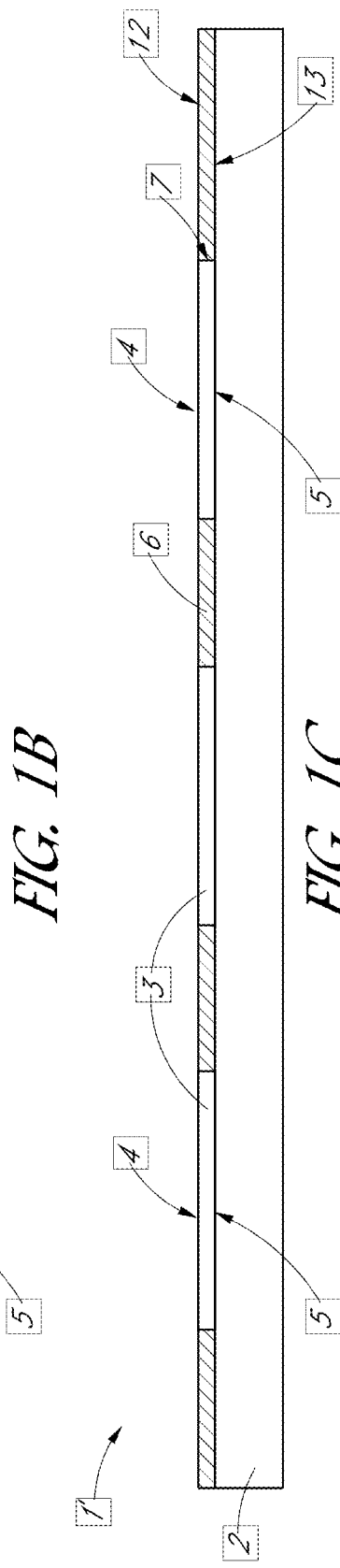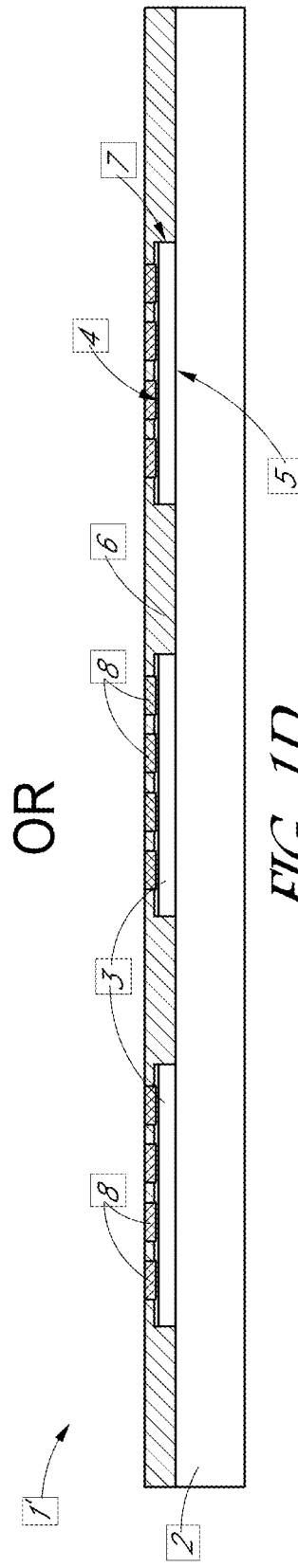

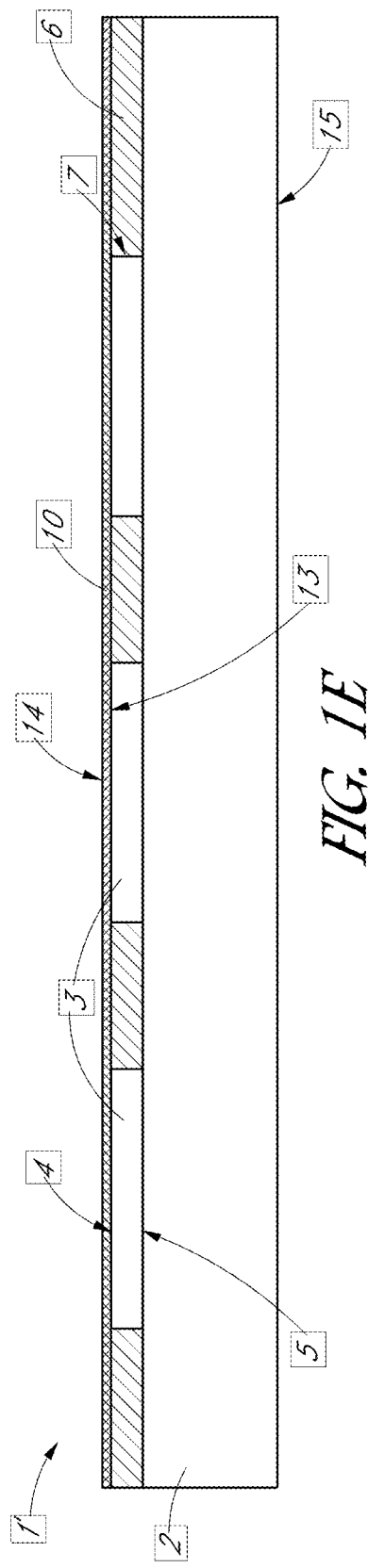
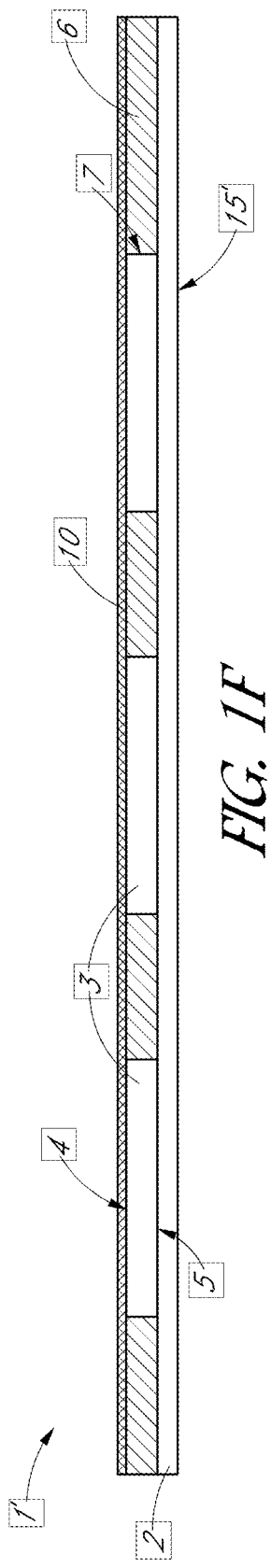
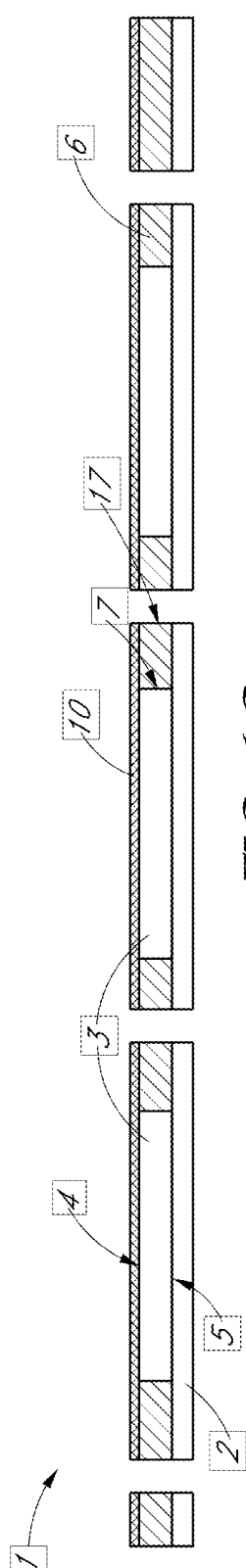
FIG. 1E
FIG. 1F
FIG. 1G

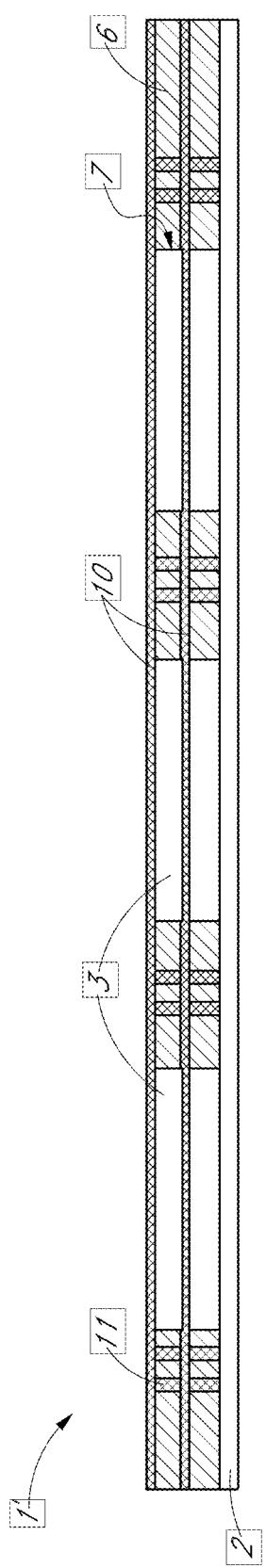
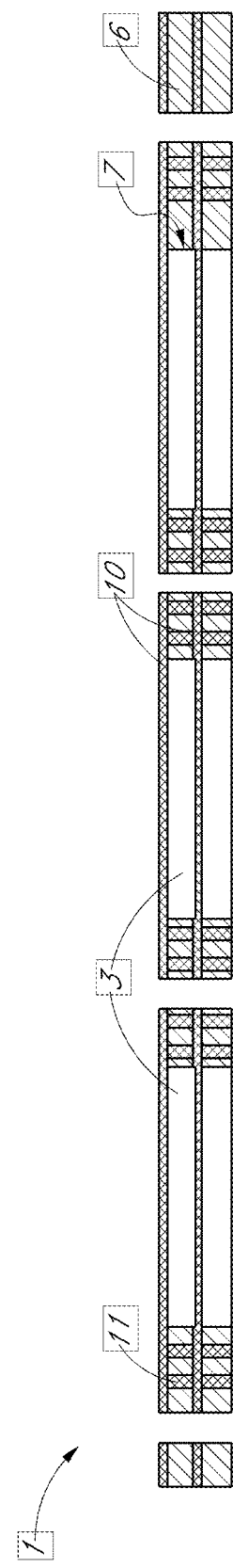
FIG. 1J
FIG. 1K

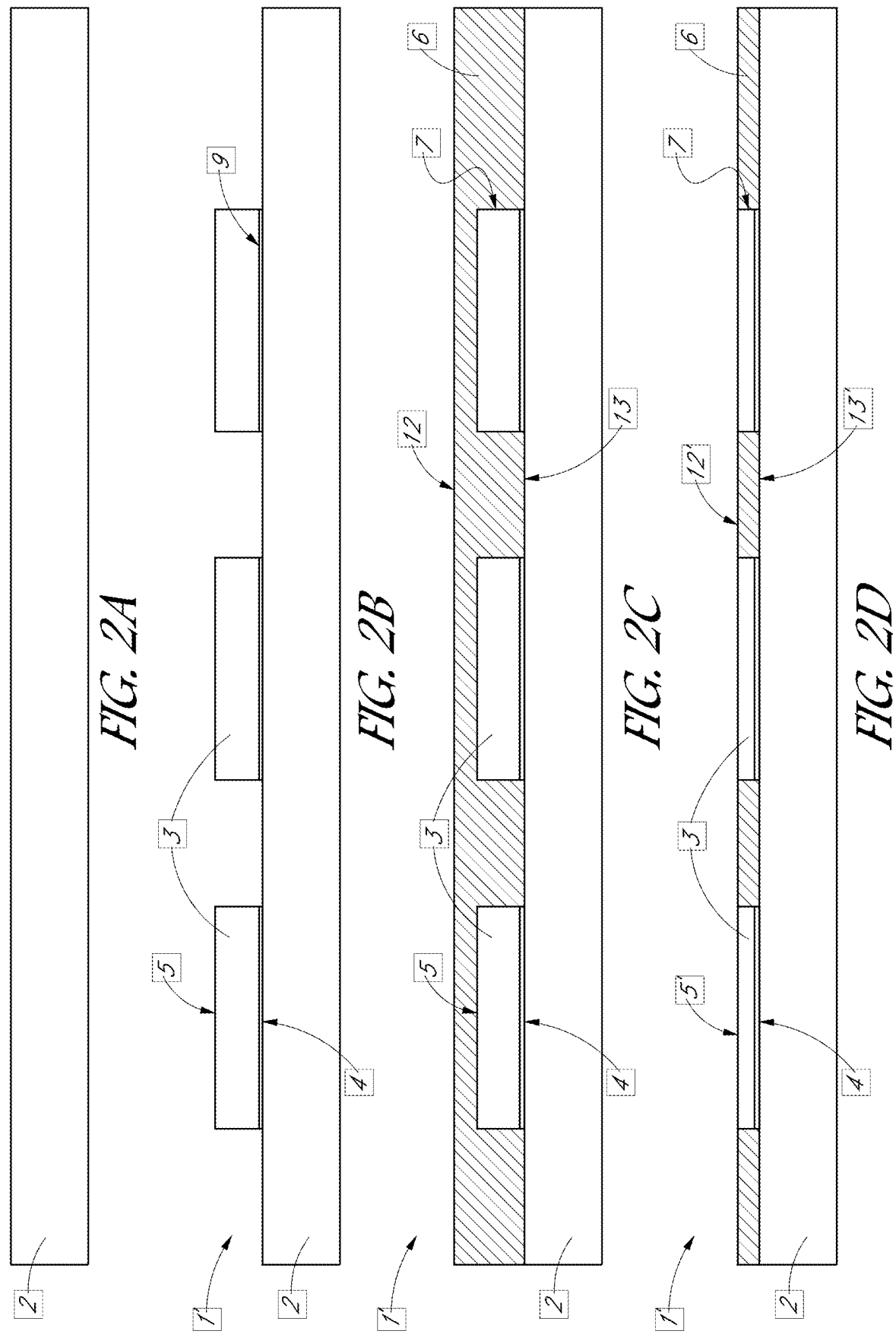

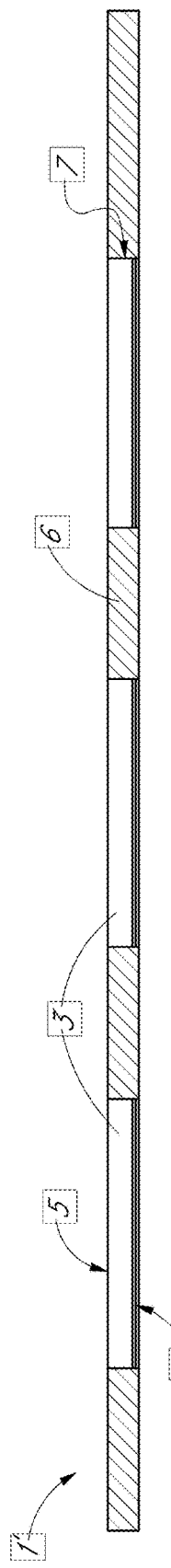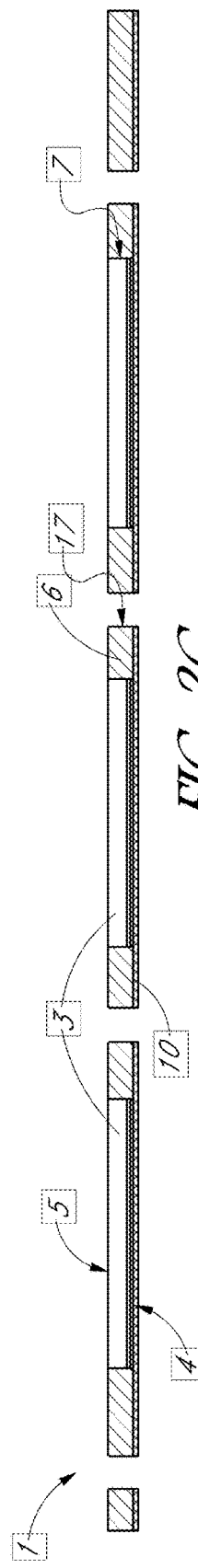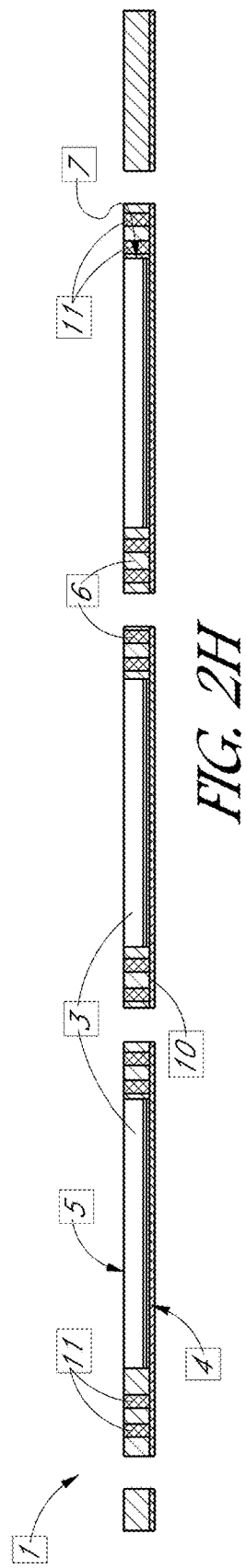

MICROELECTRONIC ASSEMBLIES

CROSS-REFERENCE TO RELATED APPLICATIONS

This application claims priority to U.S. Provisional Patent Application No. 62/694,543, filed on Jul. 6, 2018, the entire contents of which are incorporated by reference herein in their entirety and for all purposes.

BACKGROUND

Field of the Invention

The field relates to microelectronic assemblies and, in particular, to microelectronic assemblies comprising packages (e.g., fanout or fan-in packages) that include one or more components that are directly bonded to one another without an intervening adhesive.

Description of the Related Art

In various packaging arrangements, singulated integrated device dies can be adhered with an adhesive onto a carrier such as tape or film. The singulated integrated device dies can be overmolded with a molding compound, forming what is sometimes referred to as a reconstituted wafer for further processing. Relatively fine-pitched electrical contacts of the one or more integrated device dies can be fanned out over the mold by a redistribution layer (RDL) to connect to relatively coarse-pitched electrodes or leads of another structure, such as a system substrate or motherboard. The dies can then be singulated from the reconstituted wafer, along with some of the side molding and overlying RDL. However, there remains a continuing need for improved packages and techniques for forming such packages.

BRIEF DESCRIPTION OF THE DRAWINGS

These aspects and others will be apparent from the following description of preferred embodiments and the accompanying drawing, which is meant to illustrate and not to limit the invention, wherein:

FIG. 1A is a schematic side view of a carrier, according to various embodiments.

FIG. 1B is a schematic side view of a partially-formed microelectronic assembly including a plurality of elements directly bonded to the carrier without an intervening adhesive.

FIG. 1C is a schematic side view of a partially-formed microelectronic assembly in which a molding compound is applied around and between adjacent elements.

FIG. 1D is a schematic side view of a partially-formed microelectronic assembly in which a molding compound is applied around and between adjacent elements, and between adjacent interconnections on front surfaces of the elements.

FIG. 1E is a schematic side view of a partially-formed microelectronic assembly in which a redistribution layer (RDL) is applied over an upper surface of the molding compound and over front surfaces of the elements.

FIG. 1F is a schematic side view of a partially-formed microelectronic assembly after at least a portion of the carrier has been removed.

FIG. 1G is a schematic side view of a plurality of microelectronic assemblies after singulation.

FIG. 1J is a schematic side view illustrating a partially-formed microelectronic assembly that comprises a stacked structure.

FIG. 1K is a schematic side view illustrating a plurality of singulated microelectronic assemblies comprising stacked structures, according to various embodiments.

FIG. 2A is a schematic side view of a carrier, according to another embodiment.

FIG. 2B is a schematic side view of a partially-formed microelectronic assembly including a plurality of elements directly bonded to the carrier without an intervening adhesive.

FIG. 2C is a schematic side view showing a molding compound applied over and between the plurality of elements on the carrier.

FIG. 2D is a schematic side view of the partially-formed microelectronic assembly of FIG. 2C, after the molding compound and elements have been thinned by a thinning process.

FIG. 2E is a schematic side view of the partially-formed microelectronic assembly of FIG. 2D, after at least a portion of the carrier has been removed.

FIG. 2F is a schematic side view of the partially-formed microelectronic assembly that includes a redistribution layer (RDL) over front surfaces of the elements.

FIG. 2G is a schematic side view showing a plurality of singulated microelectronic assemblies, according to various embodiments.

FIG. 2H is a schematic side view of a plurality of microelectronic assemblies including a plurality of through-mold vias.

DETAILED DESCRIPTION

Figure 1H:
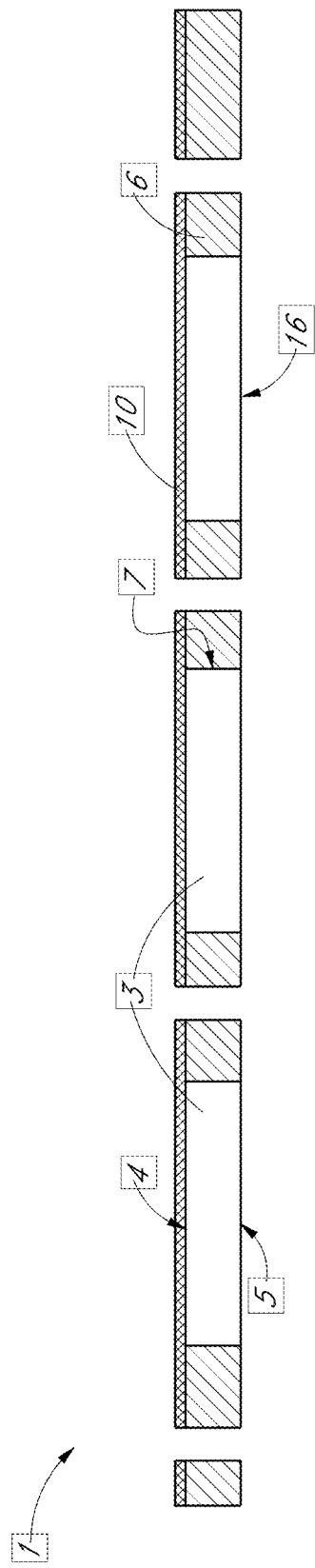
FIG. 1H is a schematic side view of a plurality of microelectronic assemblies in which the carrier has been completely removed from the elements.

Elements, including semiconductor elements such as integrated device dies (or "dies") or wafers, may be stacked in a three-dimensional (3D) arrangement, arranged laterally relative to one another in a side-by-side arrangement, or otherwise packaged to connect to an external system as part of various microelectronic packaging schemes. This can include stacking a layer of one or more elements (e.g., one or more dies, devices, and/or wafers) on a larger carrier, such as a larger base die, device, or wafer, stacking multiple dies or wafers in a vertical or horizontal arrangement, and various combinations thereof. The elements can be provided with one or more redistribution layers (RDL). The RDL can provide greater spacing between pads than the pads on the dies, thus facilitating connections with other electronic components.

For instance, one or more elements (e.g., integrated device dies) may be stacked onto a carrier (e.g., wafer, substrate, etc.) to form a packaging arrangement to facilitate interconnecting the dies with other circuits, boards, packages, and so forth. The dies may be formed with finely-pitched and finely-spaced conductive interconnections (e.g., less than about 5 microns, for example, about 1 micron, etc.) that may be densely arranged and exposed on a surface of the dies. These finely-spaced interconnections may be intended to be electrically coupled to similarly finely-spaced interconnections of a redistribution layer (RDL), which are electrically continuous with a coarser set of interconnections (fanout) of the RDL, suitable for interconnection with the other circuits, boards, packages, and so forth. In many cases, the RDL may be formed as one or more metallization layers using a lithographic process, or the like. In some embodiments that include fanout packages, electrical contacts of the RDL can be coarser than contacts on the element (e.g., die) and can extend outside the footprint of the element (e.g., die). In other embodiments, the package can comprise a fan-in package, in which electrical contacts of the RDL may be disposed within the footprint of the element (e.g., die).

One method of providing RDL involves wafer-level packaging in which dies (e.g., integrated circuits) are singulated from wafer in which they are formed and then attached to the carrier using an adhesive or the like. An overmold may be applied to at least partially cover the carrier between the dies (and in some cases cover all or a portion of the exposed surfaces of the dies), to form a reconstituted substrate (which can comprise a reconstituted wafer or panel) that may be subjected to additional processing, such as the formation of RDL layer(s) for fanning out electrical connections. By spreading out over the adjacent molding, the RDL pads can be made bigger and/or with greater spacing than the pads on the dies. However, in some cases, the dies may shift position on the carrier during the overmolding process. In those cases, the adhesive may not hold the dies firmly in their placed positions when the overmold is applied. Even a small shift of the dies can result in the lithographic mask for the fanout metallization layer not matching or aligning with the fine pitch interconnects on the die. In some cases, the pitch of the die interconnects can be increased to account for the shift of the dies, however this can restrict the pitch (and the footprint of the die) to a size that is larger than desirable for many applications. Moreover, in some arrangements, the element or die tends to get pressed into the relatively soft adhesive. When the adhesive and carrier are removed (for example, by ultraviolet release), there may be a small step between the element (e.g., die) and the molding compound because the adhesive (now released) is higher than the die. Such a step creates issues for RDL formed over the previously covered surface, as the RDL dielectric must be thick enough to overcome the step and form reliable connections, which in turn creates high aspect ratio vias to be filled.

In an embodiment disclosed herein, the dies may be bonded to the carrier using various direct bonding techniques, including direct dielectric bonding, non-adhesive techniques, such as ZiBond® or a hybrid bonding technique, such as DBI®, both commercially available from Invensas Bonding Technologies, Inc. (formerly Ziptronix, Inc.), a subsidiary of Xperi Corp. The bonding includes a spontaneous process that takes place at ambient conditions when two prepared surfaces (such as the bonding surface of the dies and a prepared surface of the carrier) are brought together (see, for example, U.S. Pat. Nos. 6,864,585 and 7,485,968, which are incorporated by reference herein in their entirety). In some examples, respective mating surfaces of the bonded dies and the carrier can include the finely-spaced conductive interconnect structures of the dies, when the dies are bonded in a "face down" arrangement, for instance.

When bonding the dies to the carrier using a direct bonding or hybrid bonding technique, it is desirable that the surfaces of the dies to be bonded and the surface of the carrier be extremely flat and smooth. For instance, in general, the surfaces should have a very low variance in surface topology (i.e., nanometer scale variance, for example below 2 nm and preferably below 0.5 nm), so that the surfaces can be closely mated to form a lasting bond. Various conventional processes, such as chemical mechanical polishing (CMP) may be used to achieve the low surface roughness. It is also usually desirable that the surfaces be clean and have a low level of impurities, particles, or other residue that are large enough in size to cause bonding voids that can cause electrical continuity failures or other bonding defects.

In various embodiments disclosed herein, bonding the dies to the carrier using a direct bonding technique at ambient conditions and without an intervening adhesive (such as ZiBond® or DBI®, for example) allows the dies to be locked into position on the carrier and remain coplanar with one another. In this locked condition, the dies are not able to shift position during overmolding, or during any other process steps. Consequently, the lithographic mask for the fanout metallization layer has a high probability of matching and aligning with the fine pitch interconnects on the die, which can be formed to have as fine a pitch as desired for the intended application.

In various implementations, the dies can be processed while bonded to the carrier. For example, the processing can include the overmolding, the addition of the metallic fanout layer (e.g., RDL), and singulation with or without removal of the carrier. In some implementations, holes or openings (e.g., cavities) may be formed in the molding, which can be filled with metallic or other conductive materials to form through vias, contact pads, and so forth.

After processing, the carrier may be thinned, etched, or grinded away. In an implementation, the removal of the carrier can reveal metallic interconnects on the exposed die surface for RDL use (when the dies are bonded "face down," for example). An additional routing layer can be added to the revealed metallic interconnects if desired. Added vias may also be revealed at the exposed surface of the die or the molding, with the removal of the carrier. In some implementations, a portion of the carrier may be allowed to remain bonded to the dies, to act as a heat sink, a handle, or a structural support. The dies may be separated by singulation, at the molded area outside the periphery of the dies, before or after removal of the carrier, to form the package arrangements desired.

FIGS. 1A-1I illustrate a face-up method for forming a microelectronic assembly 1, according to various embodiments. FIG. 1A is a schematic side view of a carrier 2, according to various embodiments. The carrier 2 can comprise any suitable support structure on which the dies can be directly bonded, such as an integrated device die, an interposer, a package substrate, an electronic device, an optical device, a wafer, a glass substrate, a silicon on insulator (SOI) substrate, etc. The use of silicon, glass, or other semiconductor material for the carrier 2 can advantageously enable the carrier 2 to be polished to a very low surface roughness for directly bonded to other elements, such as integrated device dies. In other embodiments, however, the carrier 2 can comprise substrates of other materials (e.g., a ceramic substrate, a polymer substrate, or any other suitable substrate) on which a direct bonding layer of suitable material can be formed and polished. In some embodiments, the carrier 2 can comprise active electronic circuitry. In other embodiments, the carrier 2 may not include active circuitry.

FIG. 1B is a schematic side view of a partially-formed microelectronic assembly 1 including a plurality of elements 3 directly bonded to the carrier 2 without an intervening adhesive. The elements 3, can comprise, for example, thinned integrated device dies. The elements 3 can comprise any suitable type of element, such as an integrated device die, an optical device, etc. The element 3 can comprise a microelectronic substrate having one or more active devices formed therein or thereon. For example, each of the elements 3 can comprise a processor die, a memory die, a microelectromechanical systems (MEMS) die, a passive component, an optical device, or any other suitable type of device die. Circuitry (such as active components like transistors) can be patterned at or near active surfaces of the elements 3 in various embodiments. Although only three elements 3 are shown in FIG. 1B, it should be appreciated that more or fewer than three elements 3 may be mounted to the carrier 2. Further, in some embodiments, the elements 3 may be tested for appropriate electrical functionality before mounting the elements 3 to the carrier 2. In some embodiments, only known good dies (KGDs) may be selected for mounting to the carrier 2. In other embodiments, the dies may be tested for electrical functionality after being mounted to the carrier 2 or after forming RDL. The elements 3 of FIG. 1B comprise integrated device dies having various active (and/or passive) components. In other embodiments, one or more discrete passive devices may be mounted to the substrate without being formed as part of an integrated device die.

The elements 3 can be attached to the carrier 2 using any suitable direct bonding technique to directly bond to the carrier 2 without an intervening adhesive. As shown in FIG. 1B, for example, the element 3 can include a front surface 4 and a back surface 5 opposite the front surface 4. In the embodiment of FIG. 1B, the back surface 5 can be directly bonded to the carrier 2, such that the front surface 4 faces away from the carrier 2. In various embodiments, the front surface 4 of the elements 2 can comprise a plurality of conductive interconnections (e.g., metallic pads or traces) to provide electrical communication between the element 3 and other devices. Typically, active circuitry or devices are disposed at or near the front surface 4. In some embodiments, active circuitry or devices may also be disposed at or near the back surface 5, or between the front and back surfaces 4, 5. In FIG. 1B, non-conductive field regions at the back surfaces 5 of the elements 3 can directly contact and be directly bonded with corresponding non-conductive regions of the carrier 2.

To accomplish the direct bonding, in some embodiments, bonding surfaces of the elements 3 (e.g., the back surfaces 5) and the carrier 2 can be prepared for bonding. The elements 3 can be planarized and/or polished to a very high degree of smoothness (e.g., less than 20 nm surface roughness, or more particularly, less than 5 nm surface roughness, less than 2 nm surface roughness, or less than 0.5 nm surface roughness). In some embodiments, a bonding layer (e.g., a dielectric such as silicon oxide) may be deposited on the bonding sides, e.g., the back surfaces 5 of the elements 3 and/or on the front surface of the carrier 2, and polished to a very high degree of smoothness. In some embodiments, the bonding surfaces may be fluorinated to improve bonding. The bonding surfaces may also include conductive features, such as bond pads, in various arrangements. In some embodiments, the surfaces to be bonded may be terminated with a suitable species and activated prior to bonding. For example, in some embodiments, the surfaces to be bonded may be very lightly etched for activation and exposed to a nitrogen-containing solution and terminated with a nitrogen-containing species. As one example, the surfaces to be bonded may be exposed to an ammonia dip after a very slight etch, and/or a nitrogen-containing plasma (with or without a separate etch).

Once the surfaces are prepared, the nonconductive field regions at the back surfaces 5 of the elements 3 can be brought into contact with corresponding nonconductive regions of the carrier 2. The interaction of the activated surfaces can cause the nonconductive regions of the elements 3 to directly bond with the corresponding nonconductive regions of the carrier 2 without an intervening adhesive along a bonding interface 9, without application of external pressure, without application of voltage, and at room temperature. Such room temperature, atmospheric or reduced pressure bonding can result in bond strengths of about of at least 500 mJ/m$^2$, at least 1000 mJ/m$^2$, or at least 2000 mJ/m$^2$, for example, in a range of 500 mJ/m$^2$ to 2000 mJ/m$^2$. In various embodiments, the carrier 2 and elements 3 may be heated after bonding to strengthen the bonds between the nonconductive regions to cause the elements 3 to bond with the carrier 2. After annealing, the bond strength can increase to above 2000 mJ/m$^2$, for example, about 2500 mJ/m$^2$. Additional details of direct bonding processes may be found throughout U.S. Pat. Nos. 7,126,212; 8,153,505; 7,622,324; 7,602,070; 8,163,373; 8,389,378; 8,735,219; 9,953,941; and 10,204,893, the contents of each of which are hereby incorporated by reference herein in their entirety and for all purposes.

FIGS. 1C and 1D illustrate alternative methods for molding the partially-formed microelectronic assembly 1 of FIG. 1B. For example, FIG. 1C is a schematic side view of the partially-formed microelectronic assembly 1, in which an overmold or molding compound 6 is provided over a surface of the carrier 2 between and around the elements 3. A plate (not shown) can be provided over the front surfaces 4 of the elements 3, and the molding compound 6 can be flowed between the plate and the carrier 2, such that the molding compound 6 underfills spaces or gaps between adjacent elements 3 and under the plate. The molding compound 6 can accordingly be applied to an area of the exposed surface of the carrier 2 that surrounds the elements 3. Further, as shown, the molding compound 6 can be disposed along and can contact side surfaces 7 of the elements 3, which side surfaces 7 may be defined by bulk semiconductor material. The plate can ensure that the upper surface 12 of the molding compound 6 is generally co-planar or flush with the front surfaces 4 of the elements 3 (for example, within 1 µm, or within 0.25 µm), while direct bonding the elements 3 with the carrier 2 can ensure the back surface 5 are flush with the molding compound 6. For example, in various embodiments, the upper surface 12 of the molding compound 6 can be co-planar with the front surfaces 4 of the elements 3 within about 1 µm. Significantly, the back surface 13 of the mold compound 6 can be co-planar with the back surfaces of the elements 3 within about 1 µm, due to replacement of adhesive with direct bonding. In some embodiments, the co-planarity may be within about 0.05 µm to about 0.15 µm.

The molding compound 6 can comprise an organic filler material (such as an epoxy, a resin, etc.) that can have a flowable state in which the molding compound 6 flows between the elements 3. The molding compound 6 can be cured to form a hardened or cured state. In various embodiments, the molding compound can comprise an epoxy resin, for example, an epoxy resin with filler particles, such as silicon oxide filler particles. As explained above, in other processes in which the elements 3 are adhered to the carrier 2 with an adhesive, the overmolding process can cause the elements 3 to shift, which can cause misalignment when connecting pads to a fanout metallization layer. Beneficially, the embodiments disclosed herein can avoid such lateral shifts of the elements 3 during overmolding, because the direct bond between the elements 3 and the carrier 2 effectively lock the elements 3 in place laterally. Moreover, direct bonding advantageously obviates the use of an adhesive, which can prevent the step that results from the elements 3 sinking into the adhesive and loss of co-planarity, as explained above.

In a variant shown in FIG. 1D, conductive interconnections 8 (e.g., bond pads) can be provided on and can extend above the front surface 4 of the element 3. In FIG. 1D, a plate can be provided over the conductive interconnections 8, and the molding compound 6 can be flowed over the area of the surface of the carrier 2 surrounding the elements 3. As with FIG. 1C, in FIG. 1D, the molding compound 6 can extend along and contact the side surfaces 7 of the elements 3. Moreover, the molding compound 6 can flow between adjacent conductive interconnections 8 at the front surfaces 4 of the elements 3. As with FIG. 1C, the direct bonding of the elements 3 to the carrier 2 can prevent shifting of the elements 3 during overmolding and can prevent the formation of a step between the elements 3 and molding compound 6.

Turning to FIG. 1E, a redistribution layer (RDL) 10 can be provided over the upper surface 12 of the molding compound 6 and over the front surfaces 4 of the elements 3. The RDL 10 can comprise a first surface 13 having finely-spaced electrical interconnections (not shown) that are electrically coupled to the similarly finely-spaced conductive interconnections (such as interconnections 8) at the front surfaces 4 of the elements 3. The finely-spaced interconnections of the RDL 10 can be in electrical connection with a coarser set of interconnections (fanout) at a second surface 14 of the RDL 10. The coarser set of interconnections can be suitable for interconnection with the other circuits, boards, packages, and so forth. In many cases, the RDL 10 may be formed as one or more metallization layers using a lithographic process. In other embodiments, the RDL 10 can be part of a structure that is directly hybrid bonded to the front surfaces 4 of the elements 3 without an intervening adhesive. In various embodiments, the RDL 10 can electrically connect to other devices that are stacked on the element(s) 3. In some embodiments, adjacent elements 3 may remain adjacent to one another after singulation and in common connection to the RDL 10, in which case the RDL 10 can electrically interconnect adjacent elements 3, e.g., first and second microelectronic substrates.

The RDL 10 of FIG. 1E can accordingly enable the fanout of electrical signals from the finely-spaced interconnections at the front surfaces 4 of the elements 3 to coarser interconnections at the second surface 14 of the RDL 10. For example, the conductive interconnections (such as interconnections 8) at the front surfaces 4 of the elements 3 can be spaced by less than 20 μm, or less than 15 μm, or less than 5 μm, e.g., in a range of 1 μm to 20 μm. The coarser interconnections at the second surface 14 of the RDL 10 can have spacings in a range of 5 μm to 20 μm. Moreover, due to co-planarity provided by direct bonding, the RDL 10 can be made thinner than RDLs of other techniques. For example, the RDL 10 of the disclosed embodiments can include metal layers on or within dielectric layers of less than about 5 μm, such as 1-4 μm, or in some embodiments less than about 1 μm. Moreover, the RDL metal lines can have very fine pitch, such as about 10 μm using today's metallization technology for RDL, but can be finer for future technologies given the precision afforded by direct bonding.

Turning to FIG. 1F, at least a portion of a backside 15 (see FIG. 1E) of the carrier 2 can be removed to form a planarized backside 15' (see FIG. 1F). In the embodiment of FIG. 1F, only a portion of a thickness of the carrier 2 has been removed. The remaining portion of the carrier 2 can serve as at least one of a heat sink, a handle, or a structural support. In various embodiments, the at least a portion of the backside 15 can be removed by lapping, etching, polishing, or any other suitable removal technique. In other embodiments, the carrier 2 can be sacrificial such that the entire carrier 2 can be removed from the molding compound 6 and the elements 3. In embodiments in which the entire carrier 2 is removed, a bonding layer of the elements 3 (such as a silicon oxide layer) and/or the molding compound 6 can serve as a stop (e.g., an etch stop, etc.) for the removal process. In either case, the at least partial removal of the carrier 2 can result in a planar backside (e.g., planarized backside 15' of the carrier 2 or planar bonding surface of the element 3 together with the back surface of the molding compound 6) of the microelectronic assembly 1. The planar backside of the microelectronic assembly 1 can be directly bonded to other devices or elements without an intervening adhesive.

In FIG. 1G, the microelectronic assembly 1' can be singulated through the carrier 2 and the molding compound 6 to form a plurality of microelectronic assemblies 1. For example, the microelectronic assembly 1' can be singulated by sawing through the carrier 2 and the molding compound 6, or just through the molding compound 6 if the carrier was fully removed. After singulation, the molding compound 6 and the RDL 10 can include one or more singulated side surfaces 17 that include markings indicative of a singulation process. For example, the singulated side surfaces 17 can include saw markings. It should be appreciated that although each singulated microelectronic assembly 1 of FIG. 1G includes a single element 3, in other arrangements, the assembly 1 can include a plurality of elements 3 to form a system-in-package. For example, the assembly 1 can include a plurality of elements 3 stacked on one another and/or disposed laterally adjacent to one another.

FIG. 1H illustrates an arrangement in which the carrier 2 has been completely removed from the molding compound 6 and the elements 3. In some embodiments, a majority of the carrier 2 can be removed, except for a bonding layer that may include conductive interconnects embedded in a nonconductive or dielectric region. The carrier 2 can be removed prior to singulation, e.g., prior to the step shown in FIG. 1G. In other embodiments, the carrier 2 can be removed after singulation. In FIG. 1H, each singulated microelectronic assembly 1 can be connected to other structures. For example, each microelectronic assembly 1 can electrically connect to other structures at top or bottom surfaces of the assembly 1. For example, the RDL 10 at upper surfaces of the microelectronic assembly 1 can be electrically connected (e.g., wire bonded, flip chipped, directly hybrid bonded) to other structures, such as other packages, other carriers, other device dies, etc. See, for example, FIG. 1J, described in more detail below.

Moreover, the back surfaces 5 of the elements 3 can be electrically connected (e.g., directly bonded) to other structures as well. In such arrangements, back surfaces 5 of the elements 3 can be electrically connected (e.g., directly bonded) to other structures, such as other packages, other dies, other carriers, etc. For example, in various embodiments, singulated packages or microelectronic assemblies 1 can comprise a plurality of elements (e.g., dies) that are electrically connected to one another by way of conductive traces and contacks of the RDL 10. In some embodiments, the back surfaces 5 can include a bonding layer including a nonconductive field region with conductive interconnects defined therein or thereon. The bonding layer (e.g., the nonconductive field region and the conductive interconnects) can be directly bonded to corresponding nonconductive field regions and conductive interconnects of other structures without an intervening adhesive. In various embodiments, for example, the bonding layer can be provided at the back surfaces 5 of the elements 3 by deposing the bonding layer at the back surfaces 5. In other embodiments, the bonding layer of the carrier 2 (which can include nonconductive field regions and conductive contacts) can remain after the at least a portion of the carrier 2 is removed. In such an arrangement, the remaining bonding layer of the carrier 2 can serve to electrically connect to other structures. In still other embodiments in which a portion of the carrier 2 remains connected to the elements 3 and the molding compound 6, the carrier 2 can serve as an interposer to connect to the other structures.

Figure 1I:
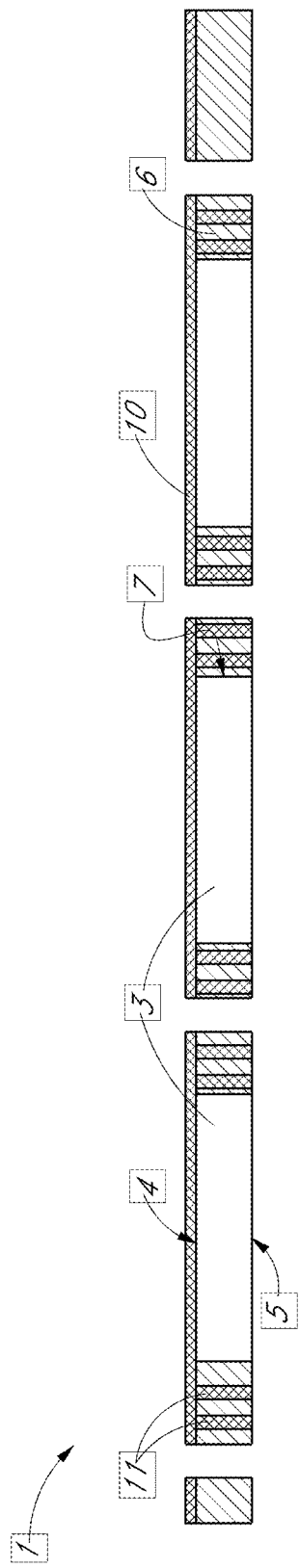
FIG. 1I is a schematic side view of a plurality of microelectronic assemblies including a plurality of through-mold vias.

FIG. 1I is a schematic side view of a plurality of microelectronic assemblies 1 including vias 11 that extend from the RDL 10 through the molding compound 6 to the back surface of the molding compound 6. Thus the illustrated vias 11 can be referred to as through-mold vias. To form the vias 11, one or more cavities can be formed (e.g., etched), and a conductive material can be provided in the cavities to form the conductive vias 11. The vias 11 can provide electrical communication between the RDL 10 and other structures (not shown) which may electrically connect to the back side of the molding compound 6 and elements 3. The vias 11 can be formed at the same time as the RDL layer 10 shown in FIG. 1E. Beneficially, the use of the through-mold vias 11 can be less costly and complicated to manufacture than through-substrate vias, e.g., vias that pass through elements 3. In some embodiments, the elements 3 may not include through-substrate vias. In other embodiments, the elements 3 may include through-substrate vias.

For example, as shown in FIG. 1J, the microelectronic assembly 1' can include a plurality of elements 3 stacked on top of one another. In the embodiment of FIG. 1J, for example, the elements 3 can be stacked prior to singulation. Additional elements 3 can be stacked on the lower layer of elements 3 and directly bonded to the RDL 10. Molding compound can be applied between adjacent elements 3 as explained above, and RDL 10 can be provide over the stacked structure. In various embodiments, the adjacent molding compounds can be bonded with any suitable technique, such as, thermocompression bonding, direct bonding without an adhesive, etc. In various embodiments in which the molding compound 6 is direct bonded to vertically adjacent molding compound, a bonding layer (such as a silicon oxide bonding layer) can be applied between adjacent portions of the molding compound 6.

In another embodiment, two reconstituted wafers can each be formed, including RDL formation, and direct hybrid bonded to one another. Any suitable number of elements 3 can be stacked on top of one another. The assembly 1' can be subsequently singulated into a plurality of singulated microelectronic assemblies 1 as shown in FIG. 1K. Moreover, as explained above, the carrier 2 can be completely removed in some embodiments, such as that shown in FIG. 1K. In other embodiments, at least a portion of the carrier 2 can remain bonded to the lower layer of elements 3. Although FIG. 1J illustrates stacked elements 3, in other embodiments, the elements 3 may not be stacked. For example, in other embodiments, the singulated assembly 1 may include laterally-spaced elements 3 after singulation, or only one element 3.

FIGS. 2A-2H illustrate a face-down method for forming a microelectronic assembly 1, according to various embodiments. Unless otherwise noted, the components of FIGS. 2A-2H may be the same as or generally similar to like-numbered components of FIGS. 1A-1I. For example, as with FIG. 1A, the carrier 2 can be provided in FIG. 2A. The carrier 2 can provide any suitable carrier, as explained above. In FIG. 2B, a plurality of elements 3 can be directly bonded to the carrier 2. However, unlike the embodiment of FIG. 1B, in FIG. 2B, the front surfaces 4 of the elements 3 can be directly bonded to the carrier 2 without an intervening adhesive. As explained above, the front surfaces 4 of the elements 3 can include conductive interconnections (not shown in FIG. 2B) embedded within or surrounded by a nonconductive field region. The conductive interconnections and nonconductive field region can be directly hybrid bonded to corresponding conductive interconnections and nonconductive field region of the carrier 2 along the bonding interface 9. Thus, in FIG. 2B, the front surfaces 4 of the elements 3 can face and be directly bonded to the carrier 2, and the back surfaces 5 can face away from the carrier 2.

Turning to FIG. 2C, the molding compound 6 can be applied over the elements 3 and areas of the surface of the carrier 2 between adjacent elements 3. As above, the molding compound 6 can be disposed along an upper surface of the carrier 2 and along side surfaces 7 of the elements 3. The molding compound 6 can comprise a filler material, such as a curable epoxy in various embodiments. Beneficially as explained above, the use of direct bonding to mount the elements 3 to the carrier 2 can prevent the elements from laterally shifting during overmold and can facilitate coplanarity of the molding compound with element surfaces.

In FIG. 2D, the elements 3 and molding compound 6 can be thinned during a thinning process. For example, in various embodiments, the back surfaces 5 of the elements 3 and the upper surface 12 of the molding compound 6 can be lapped, grinded, or otherwise thinned to form thinned back surfaces 5' of the elements 3 and thinned upper surfaces 12' of the molding compound 6. As with the embodiment of FIGS. 1A-1K, the back surfaces 5' of the elements 3 can be substantially co-planar with the upper surfaces 12' of the molding compound 6, while direct bonding also facilitates co-planarity between the lower surfaces 13' of the molding compound 6 and the front surfaces 4 of the elements 3. Co-planarity can be, for example, within about 1 µm, for example, within about 0.1 µm.

Turning to FIG. 2E, at least a portion of the carrier 2 can be removed from the front surfaces 4 of the elements 3 and the lower surface of the molding compound 6. In some embodiments, the carrier 2 can be completely removed, e.g., removed except for a native oxide layer at the upper surface of the carrier 2). In some embodiments, for example, the carrier 2 can be removed by etching. In such arrangements, the native oxide layer can serve as a stop (e.g., an etch stop) for the removal process. The remaining native oxide layer may be less than 5 nm thick, e.g., 2 nm or less. In other embodiments, in which the carrier 2 includes a relatively thick bonding layer (such as an oxide layer), the majority of the carrier 2 (e.g. the silicon substrate) can be removed while leaving the bonding layer bonded to the elements 3 and the molding compound 6. In such an arrangement, the bonding layer can include contacts or traces within an oxide layer (or other dielectric layer) to serve as a routing layer, which can connect to structures below the front surfaces 4 of the elements 3. Once the at least a portion of the carrier 2 has been removed, the exposed front surfaces 4 can be planar, e.g., having a surface roughness of less than about 1 micron.

Moreover, the front surfaces of the elements 3 can be generally co-planar with the exposed lower surface 13' of the molding compound 6, as noted above.

In FIG. 2F, the RDL 10 can be provided over the front surfaces 4 of the elements 3 and over the lower surface 13' of the molding compound 6. The RDL 10 may be generally similar to the RDL 10 described above in connection with FIGS. 1A-1K, and can provide a fanout electrical connection from relatively fine pitches of contacts on the elements 3 to relatively coarse pitches of contacts on a lower surface of the RDL 10, as described above. In FIG. 2G, the partially-formed microelectronic assembly 1' of FIG. 2F can be singulated into a plurality of microelectronic assemblies 1, in a manner similar to that explained above in connection with FIGS. 1A-1K. For example, the molding compound 6 and the RDL 10 can include side surface(s) 17 having markings indicative of a singulation process, such as saw markings. Further, as shown in FIG. 2H, in some embodiments, a plurality of through-mold vias 11 can be provided to provide electrical communication through the molding compound 6. The microelectronic assembly 1 of FIGS. 2I-2J can be stacked or arranged in any other suitable combination, as explained above with respect to FIGS. 1A-1K.

Figure 3:
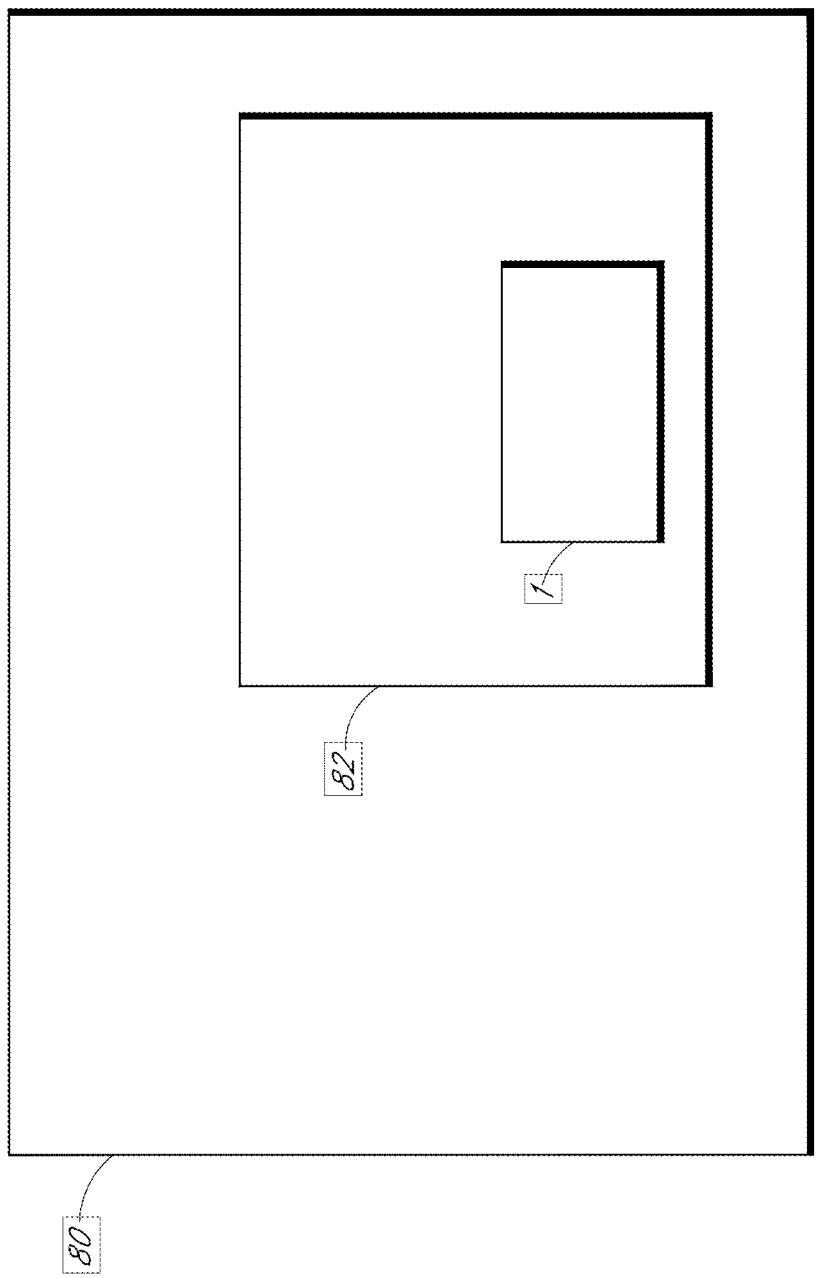
FIG. 3 is a schematic diagram of a system incorporating one or more microelectronic assemblies, according to various embodiments.

FIG. 3 is a schematic diagram of a system 80 incorporating one or more microelectronic assemblies 1, according to various embodiments. The system 80 can comprise any suitable type of electronic device, such as a mobile electronic device (e.g., a smartphone, a tablet computing device, a laptop computer, etc.), a desktop computer, an automobile or components thereof, a stereo system, a medical device, a camera, or any other suitable type of system. In some embodiments, the electronic device can comprise a microprocessor, a graphics processor, an electronic recording device, or digital memory. The system 80 can include one or more device packages 82 which are mechanically and electrically connected to the system 80, e.g., by way of one or more motherboards. Each package 82 can comprise one or more microelectronic assemblies 1. The microelectronic assemblies 1 shown in FIG. 3 can comprise any of the microelectronic assemblies 1 shown and described above in connection with FIGS. 1A-2H. The microelectronic assembly 1 can include one or more integrated device dies which perform various functions for the system 80.

In one embodiment, a method of forming a microelectronic assembly is disclosed. The method can include bonding a first surface of at least one microelectronic substrate to a surface of a carrier using a direct bonding technique without an intervening adhesive, the microelectronic substrate having a plurality of conductive interconnections on at least one surface of the microelectronic substrate. The method can include applying a molding material to an area of the surface of the carrier surrounding the microelectronic substrate to form a reconstituted substrate. The method can include processing the microelectronic substrate. The method can include singulating the reconstituted substrate at the area of the surface of the carrier and at the molding material to form the microelectronic assembly.

In another embodiment, a microelectronic assembly is disclosed. The microelectronic assembly can include an element having a front surface and a back surface opposite the front surface, at least one of the front and back surfaces comprising a planarized direct bonding surface. The microelectronic assembly can include a molding compound disposed around the element, the molding compound disposed along a side surface of the element, the molding compound including a first surface and a second surface opposite the first surface. The microelectronic assembly can include a redistribution layer (RDL) disposed over and electrically connected to the front surface of the element. The first surface of the molding compound can be substantially co-planar with the planarized direct bonding surface.

In another embodiment, a method of forming a microelectronic assembly is disclosed. The method can include directly bonding a first surface of an element to a carrier without an intervening adhesive, the element having a plurality of exposed conductive interconnections on at least one surface of the element. The method can include applying a molding compound around the element and along a side edge of the element. The method can include providing a redistribution layer (RDL) over and electrically connected to the at least one surface of the element. The method can include singulating through the RDL and the molding compound to form the microelectronic assembly.

For purposes of summarizing the disclosed embodiments and the advantages achieved over the prior art, certain objects and advantages have been described herein. Of course, it is to be understood that not necessarily all such objects or advantages may be achieved in accordance with any particular embodiment. Thus, for example, those skilled in the art will recognize that the disclosed implementations may be embodied or carried out in a manner that achieves or optimizes one advantage or group of advantages as taught or suggested herein without necessarily achieving other objects or advantages as may be taught or suggested herein.

All of these embodiments are intended to be within the scope of this disclosure. These and other embodiments will become readily apparent to those skilled in the art from the following detailed description of the embodiments having reference to the attached figures, the claims not being limited to any particular embodiment(s) disclosed. Although this certain embodiments and examples have been disclosed herein, it will be understood by those skilled in the art that the disclosed implementations extend beyond the specifically disclosed embodiments to other alternative embodiments and/or uses and obvious modifications and equivalents thereof. In addition, while several variations have been shown and described in detail, other modifications will be readily apparent to those of skill in the art based upon this disclosure. It is also contemplated that various combinations or sub-combinations of the specific features and aspects of the embodiments may be made and still fall within the scope. It should be understood that various features and aspects of the disclosed embodiments can be combined with, or substituted for, one another in order to form varying modes of the disclosed implementations. Thus, it is intended that the scope of the subject matter herein disclosed should not be limited by the particular disclosed embodiments described above, but should be determined only by a fair reading of the claims that follow.

What is claimed is:

1. A method of forming a microelectronic assembly, comprising:
    planarizing at least one of a first surface of a microelectronic substrate and a surface of a carrier in preparation for a direct bonding technique;
    bonding the first surface of the microelectronic substrate to the surface of the carrier using the direct bonding technique such that a non-conductive field region of the first surface is directly bonded with a non-conductive field region of the carrier without an intervening adhesive, the microelectronic substrate having a plurality of conductive interconnections on at least one surface of the microelectronic substrate;

applying a molding material to an area of the surface of the carrier surrounding the microelectronic substrate to form a reconstituted substrate;

processing the microelectronic substrate;

removing at least a portion of the carrier; and singulating the reconstituted substrate at the area of the surface of the carrier and at the molding material to form the microelectronic assembly.

2. The method of forming a microelectronic assembly of claim 1, wherein the planarizing the first surface of the microelectronic substrate and/or the surface of the carrier to have a surface roughness of less than 20 nm.

3. The method of forming a microelectronic assembly of claim 1, wherein bonding the microelectronic substrate to the surface of the carrier comprises facing the plurality of conductive interconnections away from the surface of the carrier.

4. The method of forming a microelectronic assembly of claim 1, wherein bonding the microelectronic substrate to the surface of the carrier comprises facing the plurality of conductive interconnections toward the surface of the carrier.

5. The method of forming a microelectronic assembly of claim 4, further comprising removing a portion of the molding material covering the microelectronic substrate and/or thinning the microelectronic substrate to reveal an exposed surface of the microelectronic substrate.

6. The method of forming a microelectronic assembly of claim 1, further comprising applying the molding material to at least a portion of a second surface of the microelectronic substrate opposite the first surface.

7. The method of forming a microelectronic assembly of claim 1, further comprising forming one or more cavities in the molding material and filling the one or more cavities with a conductive material to form one or more conductive vias.

8. The method of forming a microelectronic assembly of claim 1, further comprising preventing the microelectronic substrate from shifting position relative to the surface of the carrier during the processing by using the direct bonding technique without adhesive.

9. The method of forming a microelectronic assembly of claim 1, further comprising forming a redistribution layer (RDL) coupled to the plurality of exposed conductive interconnections.

10. The method of forming a microelectronic assembly of claim 9, wherein the microelectronic substrate comprises at least a first microelectronic substrate and a second microelectronic substrate, and wherein the RDL electrically interconnects the first microelectronic substrate and the second microelectronic substrate.

11. The method of forming a microelectronic assembly of claim 1, wherein the carrier comprises a sacrificial carrier, and wherein removing at least a portion of the carrier comprises removing the carrier from the microelectronic substrate after processing the microelectronic substrate.

12. The method of forming a microelectronic assembly of claim 11, further comprising adding a routing layer to an exposed surface revealed by thinning or removing the carrier from the microelectronic substrate.

13. The method of forming a microelectronic assembly of claim 1, further comprising allowing at least a portion of the carrier to remain bonded to the microelectronic substrate after the singulating, the at least a portion of the carrier comprising a heat sink, a handle, or a structural support.

14. The method of forming a microelectronic assembly of claim 1, wherein a spacing on the microelectronic substrate between adjacent interconnections of the plurality of conductive interconnections is less than 5 microns.

15. A method of forming a microelectronic assembly, comprising:

planarizing at least one of a first surface of an element and a non-conductive field region of a carrier in preparation for a direct bonding technique;

directly bonding the first surface of the element to the carrier such that a non-conductive field region of the first surface is directly bonded with the non-conductive field region of the carrier without an intervening adhesive, the element having a plurality of exposed conductive interconnections on the first surface or a second surface of the element opposite the first surface;

applying a molding compound around the element and along a side edge of the element;

providing a redistribution layer (RDL) over and electrically connected to the first surface or the second surface of the element;

removing at least a portion of the carrier; and singulating through the RDL and the molding compound to form the microelectronic assembly.

16. The method of claim 15, further comprising bonding the element to the carrier with the plurality of exposed conductive interconnections facing away from the carrier.

17. The method of claim 15, further comprising bonding the element to the carrier with the plurality of exposed conductive interconnections facing toward the carrier.

18. The method of claim 15, wherein the second surface of the element is generally co-planar with a surface of the molding compound.

19. The method of claim 15, wherein the second surface of the element is co-planar with the surface of the molding compound within 1 µm.

* * * * *